United States Patent
Rumsey et al.

(10) Patent No.: US 6,638,595 B2
(45) Date of Patent: Oct. 28, 2003

(54) METHOD AND APPARATUS FOR REDUCED FLASH ENCAPSULATION OF MICROELECTRONIC DEVICES

(75) Inventors: Brad D. Rumsey, Meridian, ID (US); Todd O. Bolken, Meridian, ID (US); Cary J. Baerlocher, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/903,994

(22) Filed: Jul. 11, 2001

(65) Prior Publication Data

US 2002/0000675 A1 Jan. 3, 2002

Related U.S. Application Data (62) Division of application No. 09/605,582, filed on Jun. 28, 2000, now Pat. No. 6,365,434.

(51) Int. Cl.$^7$ .................. H01L 21/44; H01L 21/48; H01L 21/50
(52) U.S. Cl. .............. 428/131; 257/787; 257/797; 428/192
(58) Field of Search .............. 264/272.15; 257/787, 257/797; 428/81, 83, 131, 134, 135, 192; 438/401

(56) References Cited

U.S. PATENT DOCUMENTS

| | | | |
|---|---|---|---|
| 3,659,821 A | * 5/1972 | Sakamoto et al. ..... 264/272.17 |
| 4,954,308 A | 9/1990 | Yabe et al. |
| 4,984,392 A | * 1/1991 | Sekigawa et al. .............. 451/11 |
| 5,044,912 A | 9/1991 | Billings et al. |
| 5,192,682 A | 3/1993 | Kodai et al. |
| 5,367,766 A | 11/1994 | Burns et al. |
| 5,427,938 A | 6/1995 | Matsumura et al. |
| 5,593,927 A | 1/1997 | Farnworth et al. |
| 5,677,566 A | 10/1997 | King et al. |
| 5,696,033 A | 12/1997 | Kinsman |
| 5,728,600 A | 3/1998 | Saxelby, Jr. et al. |
| 5,739,585 A | 4/1998 | Akram et al. |
| D394,844 S | 6/1998 | Farnworth et al. |

(List continued on next page.)

FOREIGN PATENT DOCUMENTS

JP          03227553 A  * 10/1991  .......... H01L/21/68

OTHER PUBLICATIONS

Merriam–Webster Collegiate Dictionary, 1997, Merriam–Webster, Incorporated, 10$^{th}$ edition, p. 110.
Christopher Morris (ed.), Academic Press Dictionary of Science and Technology, Academic Press, Inc., San Diego, 1992, ISBN 0–12–200400–0, p. 865.

*Primary Examiner*—Robert Davis
(74) *Attorney, Agent, or Firm*—Perkins Coie LLP

(57) ABSTRACT

A method and apparatus for encapsulating microelectronic devices. In one embodiment, a microelectronic device is engaged with a support member having a first edge, a second edge opposite the first edge, and an engaging surface with at least a portion of the engaging surface spaced apart from the first and second edges. The first edge of the support member is positioned proximate to a wall of a mold and an aligning member is moved relative to the wall of the mold to contact the engaging surface of the support member and bias the first edge of the support member against the wall of the mold. The microelectronic device is then encapsulated by disposing an encapsulating material in the mold adjacent to the microelectronic device. By biasing the first edge of the support member against the wall of the mold, the method can prevent encapsulating material from passing between the first edge of the support member and the wall of the mold, where the encapsulating material would otherwise form flash. Accordingly, a method and apparatus in accordance with an embodiment of the invention can reduce or eliminate flash adjacent to the first edge of the support member.

13 Claims, 5 Drawing Sheets

U.S. PATENT DOCUMENTS

| | | | |
|---|---|---|---|
| 5,766,985 A | * 6/1998 | Mangiagli et al. | 264/272.17 |
| 5,779,958 A | * 7/1998 | Nishihara et al. | 264/272.15 |
| D402,638 S | 12/1998 | Farnworth et al. | |
| 5,851,845 A | 12/1998 | Wood et al. | |
| 5,891,753 A | 4/1999 | Akram | |
| 5,893,726 A | 4/1999 | Farnworth et al. | |
| 5,894,218 A | 4/1999 | Farnworth et al. | |
| 5,898,224 A | 4/1999 | Akram | |
| 5,933,713 A | 8/1999 | Farnworth | |
| 5,936,311 A | * 8/1999 | Watrobski et al. | 257/797 |
| 5,938,956 A | 8/1999 | Hembree et al. | |
| 5,938,996 A | 8/1999 | Bianca et al. | |
| 5,943,588 A | 8/1999 | Watrobski et al. | |
| 5,958,100 A | 9/1999 | Farnworth et al. | |
| 5,986,209 A | 11/1999 | Tandy | |
| 5,989,941 A | 11/1999 | Wensel | |
| 5,990,566 A | 11/1999 | Farnworth et al. | |
| 5,994,784 A | 11/1999 | Ahmad | |
| RE36,469 E | 12/1999 | Wood et al. | |
| 5,998,243 A | 12/1999 | Odashima et al. | |
| 6,008,070 A | 12/1999 | Farnworth | |
| 6,018,249 A | 1/2000 | Akram et al. | |
| 6,020,629 A | 2/2000 | Farnworth et al. | |
| 6,025,728 A | 2/2000 | Hembree et al. | |
| 6,028,365 A | 2/2000 | Akram et al. | |
| 6,046,496 A | 4/2000 | Corisis et al. | |
| 6,048,744 A | 4/2000 | Corisis et al. | |
| 6,048,755 A | 4/2000 | Jiang et al. | |
| 6,049,125 A | 4/2000 | Brooks et al. | |
| 6,064,194 A | 5/2000 | Farnworth et al. | |
| 6,072,233 A | 6/2000 | Corisis et al. | |
| 6,072,236 A | 6/2000 | Akram et al. | |
| 6,075,288 A | 6/2000 | Akram | |
| 6,097,087 A | 8/2000 | Farnworth et al. | |
| 6,103,547 A | 8/2000 | Corisis et al. | |
| 6,107,122 A | 8/2000 | Wood et al. | |
| 6,107,680 A | 8/2000 | Hodges | |
| 6,114,189 A | 9/2000 | Chia et al. | |
| 6,117,382 A | 9/2000 | Thummel | |
| 6,124,634 A | 9/2000 | Akram et al. | |
| 6,150,717 A | 11/2000 | Wood et al. | |
| 6,159,764 A | 12/2000 | Kinsman et al. | |
| 6,172,419 B1 | 1/2001 | Kinsman | |
| 6,184,465 B1 | 2/2001 | Corisis | |
| 6,198,172 B1 | 3/2001 | King et al. | |
| 6,208,519 B1 | 3/2001 | Jiang et al. | |
| 6,210,992 B1 | 4/2001 | Tandy et al. | |
| 6,215,175 B1 | 4/2001 | Kinsman | |
| 6,228,548 B1 | 5/2001 | King et al. | |
| 6,229,202 B1 | 5/2001 | Corisis | |
| 6,246,108 B1 | 6/2001 | Corisis et al. | |
| 6,252,772 B1 | 6/2001 | Allen | |
| 6,258,624 B1 | 7/2001 | Corisis | |
| 6,259,153 B1 | 7/2001 | Corisis | |
| 6,277,671 B1 | 8/2001 | Tripard | |
| 6,278,193 B1 | * 8/2001 | Coico et al. | 257/797 |
| 6,284,571 B1 | 9/2001 | Corisis et al. | |
| 6,291,894 B1 | 9/2001 | Farnworth et al. | |
| 6,294,839 B1 | 9/2001 | Mess et al. | |
| 6,303,981 B1 | 10/2001 | Moden | |
| 6,303,985 B1 | 10/2001 | Larson et al. | |
| 6,310,390 B1 | 10/2001 | Moden | |
| 6,314,639 B1 | 11/2001 | Corisis | |
| 6,316,285 B1 | 11/2001 | Jiang et al. | |
| 6,326,242 B1 | 12/2001 | Brooks et al. | |
| 6,326,244 B1 | 12/2001 | Brooks et al. | |
| 6,326,687 B1 | 12/2001 | Corisis | |
| 6,326,697 B1 | 12/2001 | Farnworth | |
| 6,326,698 B1 | 12/2001 | Akram | |
| 6,329,220 B1 | 12/2001 | Bolken et al. | |
| 6,331,221 B1 | 12/2001 | Cobbley | |
| 6,331,453 B1 | 12/2001 | Bolken et al. | |
| 6,332,766 B1 | 12/2001 | Thummel | |
| 6,367,635 B1 | * 4/2002 | Auer | 438/401 |
| 6,448,154 B1 | * 9/2002 | Guldi et al. | 438/462 |
| 2002/0001883 A1 | 1/2002 | Rumsey et al. | |

* cited by examiner

METHOD AND APPARATUS FOR REDUCED FLASH ENCAPSULATION OF MICROELECTRONIC DEVICES

CROSS REFERENCE TO RELATED APPLICATIONS

This application is a divisional of U.S. patent application Ser. No. 09/605,582, filed on Jun. 28, 2000 and now U.S. Pat. No. 6,365,434.

TECHNICAL FIELD

This invention relates to methods and apparatuses for packaging microelectronic devices with reduced flash.

BACKGROUND

Packaged microelectronic assemblies, such as memory chips and microprocessor chips, typically include a microelectronic device mounted to a substrate and encased in a plastic protective covering. The device includes functional features, such as memory cells, processor circuits, and interconnecting circuitry. The device also typically includes bond pads electrically coupled to the functional features. The bond pads are coupled to pins or other types of terminals that extend outside the protective covering for connecting the microelectronic device to busses, circuits and/or other microelectronic assemblies.

Figure 1:
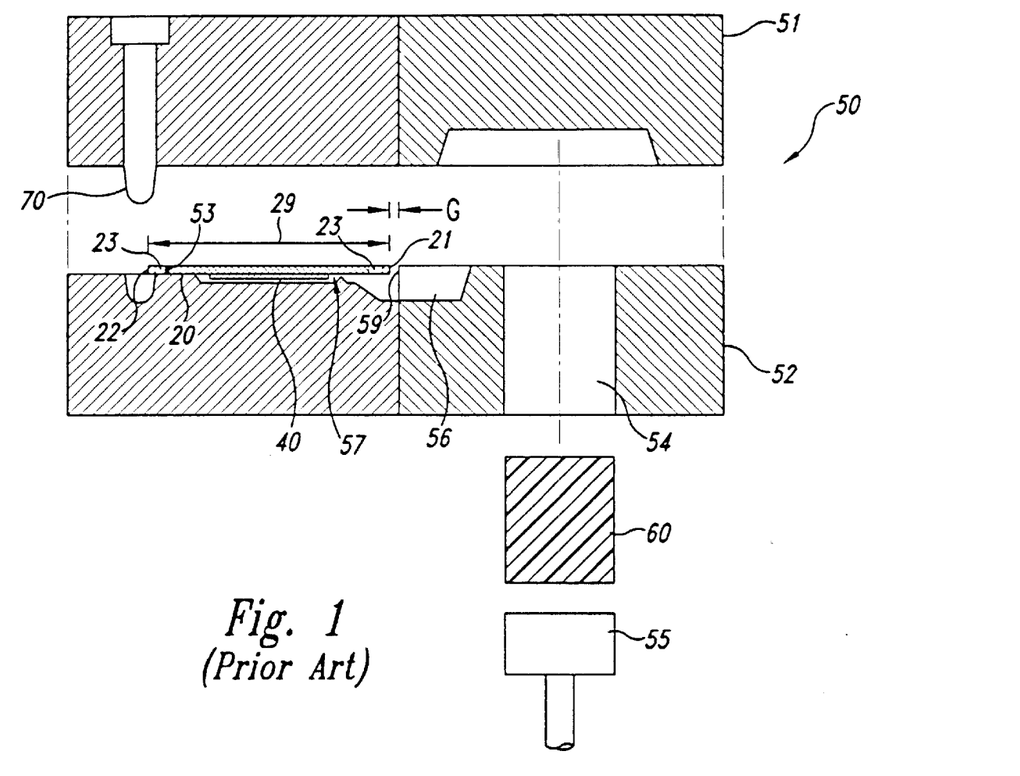
FIG. 1 is a partially schematic, cross-sectional side elevational view of a support member supporting a microelectronic device in a mold in accordance with the prior art.

In one conventional arrangement, shown in FIG. 1, a device 40 is mounted to a substrate 20, such as a printed circuit board ("PCB"). The substrate 20 and the device 40 are placed in a mold 50 for encapsulation. The mold 50 can include an upper portion 51 removably attached to a lower portion 52 to define a device cavity 57, a pellet cavity 54, and a runner cavity 56 extending between the device cavity 57 and the pellet cavity 54. The substrate 20 is clamped between the upper portion 51 and the lower portion 52 with the device 40 positioned in the device cavity 57. A pellet of mold compound 60 is placed in the pellet cavity 54 and a plunger 55 forces the pellet 60 into the device cavity 57 via the runner cavity 56 to encapsulate the device 40.

Figure 2:
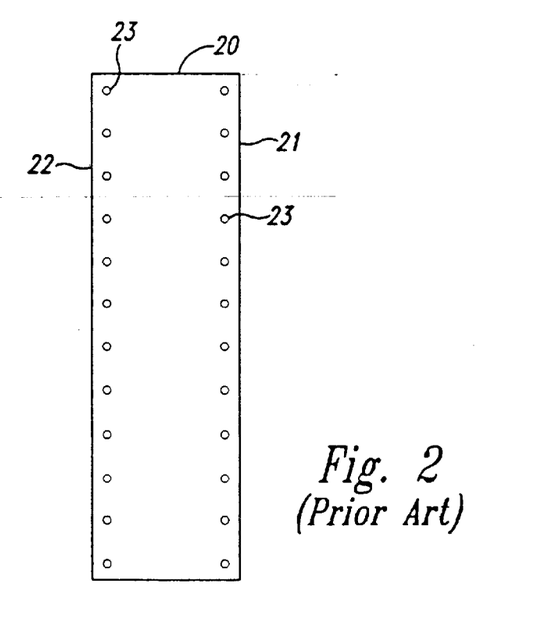
FIG. 2 is a top plan view of the support member shown in FIG. 1.

Referring now to FIGS. 1 and 2, the substrate 20 has a first edge 21, a second edge 22 opposite the first edge 21, and drilled indexing holes 23 along both edges 21 and 22. The indexing holes 23 along the second edge 22 receive undersized index pins 53 when the substrate 20 is placed in the mold 50. An alignment pin 70 engages the second edge 22 and forces the substrate 20 toward the right (as seen in FIG. 1) so that the first edge 21 of the substrate 20 approaches an edge 59 of the mold 50 as the upper portion 51 and the lower portion 52 of the mold 50 move toward each other.

In one aspect of this conventional arrangement, the first edge 21 and the second edge 22 of the substrate 20 are routed with a router tool or formed by other low-cost processes. Accordingly, a width 29 of the substrate 20 between the first and second edges 21 and 22 can have a tolerance of ±100 microns. One drawback with this approach is that the dimensional tolerance of the width 29 can lead to damaging the substrate 20 and/or forming flash around the encapsulated device 40. For example, if the substrate 20 has a width 29 toward the upper end of the tolerance range, it can buckle and/or break when the alignment pin 70 forces the substrate 20 against the mold edge 59. Conversely, if the substrate 20 has a width 29 toward the lower end of the tolerance range, a gap G can remain between the first edge 21 of the substrate and the mold edge 59, even after the alignment pin 70 has moved the substrate 20 toward the right. The gap G can fill with mold compound, creating a flange of flash extending outwardly from the first edge 21 of the substrate 20. The flash can interfere with subsequent processing steps, for example by catching on processing machines, or by separating from the substrate 20 and contaminating the machines.

SUMMARY

The present invention is directed toward methods and apparatuses for encapsulating microelectronic devices. A method in accordance with one aspect of the invention includes providing a support member having a first edge, a second edge opposite the first edge, and an engaging surface with at least a portion of the engaging surface spaced apart from the first and second edges. The method can further include engaging the microelectronic device with the support member, positioning the first edge of the support member proximate to a wall of a mold, moving an aligning member relative to the wall of the mold and biasing the first edge of the support member against the wall of the mold by engaging the aligning member with the portion of the engaging surface spaced apart from the first and second edges. The method can further include at least partially encapsulating the microelectronic device by disposing an encapsulating material in the mold adjacent to the microelectronic device.

In a further aspect of the invention, the method can include forming the engaging surface to be spaced apart from the first surface of the support member by a selected distance having a tolerance of ±50 microns or less. Biasing the first edge of the support member against the wall of the cavity can include moving the aligning member in a direction either transverse to or aligned with a surface of the support member engaged with the microelectronic device.

The invention is also directed to a support member and method for forming a support member to support a microelectronic device. The support member can include a first edge configured to engage an interior wall of the mold, a second edge opposite the first edge, an electrically conductive material between the first and second edges for coupling to the microelectronic device, and an engaging surface. In one embodiment, the engaging surface is spaced apart from the first edge by a selected distance having a tolerance of ±50 microns or less and is configured to engage an alignment member of the mold when the support member and the microelectronic device are placed in the mold with the first edge of the support member engaged with the interior wall of the mold.

DETAILED DESCRIPTION

The present disclosure describes packaged microelectronic devices and methods for packaging such devices. Many specific details of certain embodiments of the invention are set forth in the following description and in FIGS. 3–11 to provide a thorough understanding of these embodiments. One skilled in the art, however, will understand that the present invention may have additional embodiments, or that the invention may be practiced without several of the details described below.

Figure 3:
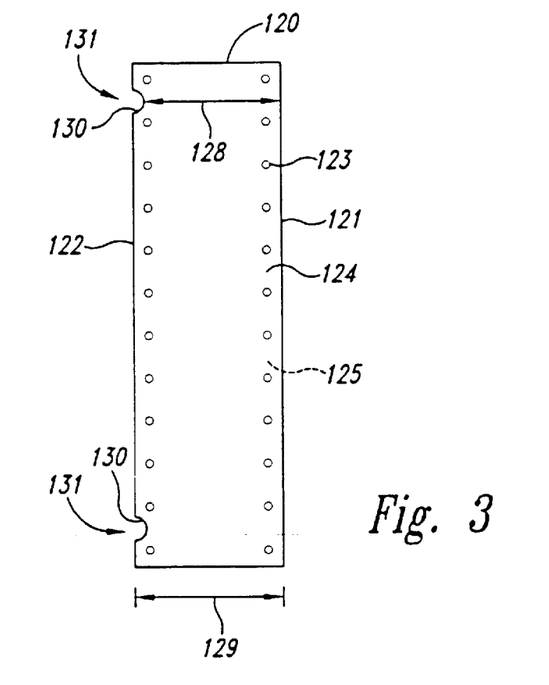
FIG. 3 is a top plan view of a support member having engaging surfaces in accordance with an embodiment of the invention.

FIG. 3 is a top plan view of a support member 120 having two engaging surfaces 130 in accordance with an embodiment of the invention. In one aspect of this embodiment, the support member 120 has an upper surface 124, a lower surface 125 facing opposite the upper surface 124, and first and second edges 121 and 122 between the upper surface 124 and the lower surface 125. Index holes 123 having a small diameter (e.g., 1.5 mm) are positioned along the edges 121 and 122. The support member 120 can include a generally non-conductive material, such as a plastic, epoxy or glass-impregnated bismalimide triazine with conductive layers and/or vias for routing electrical signals from one portion of the support member 120 to another.

In a further aspect of this embodiment, each engaging surface 130 defines a curved, semi-circular alignment aperture or notch 131 formed in the second edge 122. In yet a further aspect of the embodiment, each alignment aperture 131 extends completely through the support member 120 from the upper surface 124 to the lower surface 125. Alternatively, the alignment apertures 131 and the engaging surfaces 130 can have other configurations, such as those described below with reference to FIGS. 5, 6 and 12.

In one embodiment, the first edge 121 and each engaging surface 130 is separated by a separation distance 128 (measured along a line perpendicular to both the first edge 121 and the engaging surface 130) having a dimension that is held to a tolerance of less than ±100 microns. For example, in one aspect of this embodiment, the distance 128 is held to a tolerance of ±50 microns. Alternatively, the tolerance band can have other values greater or less than ±50 microns, so long as the tolerance band is less than ±100 microns.

In one embodiment, the engaging surfaces 130 can be formed with a conventional mechanical drill bit and the alignment apertures 131 can have a radius of approximately one half the tolerance band of the distance 128. For example, when the tolerance band is ±50 microns, the radius of the alignment aperture 131 can be at least 50 microns, and the mechanical drill bit can have a corresponding radius of approximately 50 microns. Alternatively, the drill bit and the alignment aperture can have other radii in other embodiments. For example, in one embodiment, a drill bit having radius of about 2500 microns is used for simultaneously drilling through a stack of five support members 120 to produce alignment apertures 131 spaced apart from the first edge 121 of the support member 120 by a distance 128 having a tolerance of ±50 microns. Alternatively, the drill bit can be larger or smaller than 2500 microns for drilling through one or more support members 120. For example, the drill bit radius may be larger for tolerances tighter than ±50 microns and/or for drilling through more than five support members 120, because a larger drill bit tends to "wander" less than a smaller drill bit as it cuts through a stack of support members. Alternatively, a smaller drill bit may be used when simultaneously drilling through fewer than five support members 120.

In other embodiments, the engaging surfaces 130 can be formed with other techniques. For example, the engaging surfaces 130 can be formed with a water jet or a laser beam that impinges the support member 120. In still further embodiments, the engaging surfaces 130 can be formed with other processes that hold the separation distance 128 to within a tolerance of less than ±100 microns.

Figure 4:
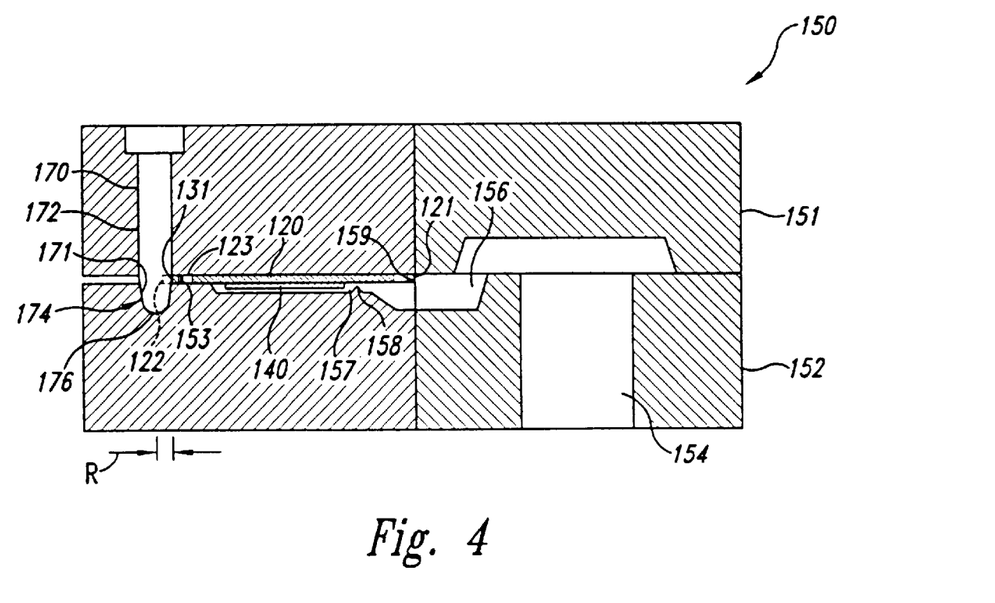
FIG. 4 is a cross-sectional side elevational view of the support member taken substantially along line 4—4 of FIG. 3 and installed in a mold apparatus having an alignment pin in accordance with an embodiment of the invention.

FIG. 4 is a cross-sectional side elevational view of the support member 120 (taken substantially along line 4—4 of FIG. 3) attached to a microelectronic device 140 and positioned in a mold apparatus 150 in accordance with an embodiment of the invention. In one aspect of this embodiment, the mold apparatus 150 includes an upper mold portion 151 removably coupled to a lower mold portion 152 with the support member 120 clamped therebetween. The device 140 is received in a device cavity 157 that is coupled to a pellet cavity 154 with a runner cavity 156. Pellets of encapsulating mold material (not shown) are heated and pressurized in the pellet cavity 154 and forced into the runner cavity 156 and the device cavity 157 to encapsulate the device 140 and a portion of the support member 120 in a manner generally similar to that described above.

In one aspect of an embodiment shown in FIG. 4, the lower mold portion 152 includes a gate 158 that provides a weak point in the encapsulated mold material for breaking a runner portion of the mold material off from the encapsulated device 140. The lower mold portion 152 can also include index pins 153 that are loosely received in the index holes 123 of the support member 120. Accordingly, the index pins 153 do not snugly engage the walls of the index holes 123. This feature reduces the likelihood that the index holes 123 will be deformed during the molding process. Therefore, the index holes 123 can more accurately position the support member 120 in subsequent process steps.

In another aspect of an embodiment of the mold apparatus 150 shown in FIG. 4, the upper mold portion 151 includes two tapered alignment pins or members 170, one of which is visible in FIG. 4. Each alignment pin 170 is snugly received in a receiving aperture 171 in the lower mold portion 152 when the upper and lower mold portions 151 and 152 are brought together. Referring now to FIGS. 3 and 4, as the alignment pins 170 descend into the receiving apertures 171, the tapered outer surface of each alignment pin engages one of the engaging surfaces 130 of the support member 120 and gradually drives the support member 120 toward the right (as seen in FIG. 4). Accordingly, the alignment pins 170 move transverse to the plane of the support member. As used herein, "transverse" refers to any non-aligned angle, including a right angle. When the upper and lower mold portions 151 and 152 clamp against the opposite surfaces 124 and 125 of the support member 120, the first edge 121 of the support member 120 is biased firmly against a mold edge 159 of the lower mold portion 152 to prevent or at least significantly restrict mold material from squeezing between the first edge 121 and the mold edge 159.

In one embodiment, each alignment pin 170 has an external alignment surface that includes a cylindrical shank 172 and a rounded end portion 174. The shank 172 and the end portion 174 can alternatively have other shapes, as described below with reference to FIGS. 8–10. In a further aspect of an embodiment shown in FIG. 4, the radius R of each alignment pin 170 is at least half the tolerance band or range of the distance 128 between the engaging surface 130 and the first edge 121 of the support member 120. For example, when the tolerance band is ±50 microns, the radius R of the shank 172 is at least 50 microns. Accordingly, when the distance 128 is undersized by 50 microns, the shank 172 contacts the engaging surfaces 130 of the support member 120, and the first edge 121 of the support member 120 just seals against the mold edge 159, when the mold portions 151 and 152 are brought together and the alignment pin 170 bottoms out in the receiving aperture 171.

When the distance 128 is neither oversized nor undersized (i.e., the distance 128 is at the center of the tolerance band), a tip 176 or another part of the end portion 174 of each alignment pin 170 engages the corresponding engaging surface 130 as each alignment pin 170 begins its descent into the receiving aperture 171, while the first edge 121 contacts the mold edge 159. As the alignment pins 170 move into the receiving apertures 171, they drive the first edge 121 of the support member 120 against the mold edge 159, compressing the support member 120 by about 50 microns and sealing the interface between the support member 120 and the mold edge 159. When the distance 128 is oversized by 50 microns, the operation is generally similar, except that the support member 120 is compressed by about 100 microns. In other embodiments, the size of the alignment pins 170 and the apertures 131 defining the engaging surfaces 130 can have other values (depending on the size of the tolerance band) that allow the support member 120 to be sealed against the mold edge 159 regardless of where (within the tolerance band) the distance 128 falls.

In one embodiment, the first edge 121 of the support member 120 is biased against the mold edge 159 with a firm but relatively light force when the support member 120 is undersized (i.e., when the distance 128 is toward the lower end of the tolerance band). When the support member is oversized (i.e., when the distance 128 is toward the upper end of the tolerance band), the alignment pins 170 exert a greater force on the support member 120, but not so great a force as to break or unacceptably buckle the support member 120. Regardless of where within the tolerance band the distance 128 falls, the amount of biasing force applied by the alignment pins 170 is independent of the overall width 129 (FIG. 3) of the support member 120, so long as the support member 120 fits in the mold apparatus 150.

In one aspect of an embodiment of the mold apparatus 150, the upper mold portion 151 includes two alignment pins 170, each positioned to engage a corresponding one of the spaced-apart engaging surfaces 130. Accordingly, each alignment pin 170 can prevent the support member 120 from rotating about the other alignment pin 170. Alternatively, the upper mold portion 151 can include a single alignment pin 170 aligned with a single engaging surface 130 positioned at, or very near, the center of the first surface 121 of the support member 120. Accordingly, the single alignment member 170 will impart a force but no moment to the support member 120. In another alternate embodiment, the upper mold portion 151 can include more than two alignment pins 170 and the support member 120 can include more than two engaging surfaces 130, as described below with reference to FIG. 5.

One feature of an embodiment of the support member 120 and the mold apparatus 150 described above with reference to FIGS. 3 and 4 is that the distance 128 between the engaging surfaces 130 and the first edge 121 of the support member 120 can be formed to have a tolerance of less than ±100 micron. An advantage of this feature is that support members 120 that are oversized (but still within the tolerance band), can be accommodated by the mold apparatus 150 without breaking or excessively warping. Furthermore, support members 120 that are undersized (but still within the tolerance band), can be accommodated in the mold apparatus 150 without leaving a gap between a first edge 121 of the support members 120 and the mold edge 159. Accordingly, the likelihood for forming flash at the first edge 121 of the support member 120 is eliminated or at least substantially reduced.

Another feature of an embodiment of the support member 120 and the mold apparatus 150 described above with reference to FIGS. 3 and 4 is that the engaging surfaces 130 need only extend for a short length along the second edge 122 of the support member 120. An advantage of this feature is that relatively inexpensive fabrication techniques can be used to form the remaining length of the second edge 122 and the entire length of the first edge 121. For example, the first and second edges 121 and 122 can be routed in a conventional, relatively low cost process, while the engaging surfaces 130 can be precision drilled with mechanical drill bits, laser beams or water jets.

In an alternate embodiment, both the engaging surfaces 130 and the first edge 121 can be precision formed, for example with a laser beam or a water jet, to reduce the tolerance band corresponding to the distance 128. The remaining edges of the substrate 120 can then be formed with lower cost processes, such as routing. An advantage of this alternate embodiment is that the likelihood for breaking and/or warping the substrate 120, and/or creating flash along the first edge 121 of the substrate 120, can be reduced even further when compared to conventional techniques for forming the substrate 120, without requiring precision techniques to form all the edges of the substrate 120. Conversely, an advantage of precision forming only the engaging surfaces 130 is that this process can be less time consuming than precision forming both the engaging surfaces 130 and the first edge 121.

Figure 5:
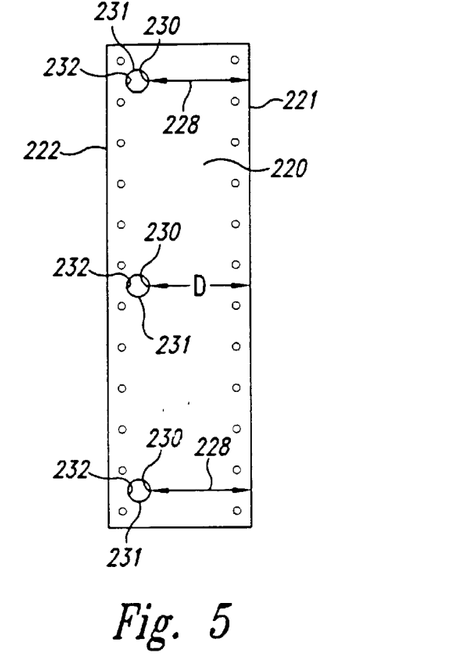
FIG. 5 is a top plan view of a support member having engaging surfaces in accordance with another embodiment of the invention.

FIG. 5 is a top plan view of a support member 220 having a first edge 221, a second edge 222, and three engaging surfaces 230 formed in accordance with another embodiment of the invention. In one aspect of this embodiment, each engaging surface 230 forms a portion of an enclosed alignment aperture 231 that is spaced apart from the first edge 221. A distance 228 between the engaging surfaces 230 and the first edge 221 can be held to tolerances generally similar to those described above with reference to FIGS. 3 and 4. Each alignment aperture 231 can include a facing surface 232 facing opposite the engaging surface 231. The distance between the facing surface 232 and either the first edge 221 or the second edge 222 of the support member 220 need not be carefully controlled to properly align the support member 220 in the mold apparatus 150 described above with reference to FIG. 4. Accordingly, the facing surface 232 can have any position relative to the edges 221 and 222, and the alignment aperture 231 can have any shape (e.g., round, elliptical, rectangular), so long as the position of the engaging surface 230 relative to the first edge 221 is within the tolerance bands described above with reference to FIGS. 3 and 4.

One feature of an embodiment of the support member 220 shown in FIG. 5 is that the support member 220 includes three alignment apertures 231. An advantage of this arrangement (when compared to the support member 120 described above with reference to FIGS. 3 and 4) is that the support member 220 may be less likely to rotate or otherwise shift within the mold apparatus 150 because it can be engaged by up to three alignment pins. Conversely, an advantage of the embodiment of the support member 120 is that it can be less expensive to manufacture than an embodiment of the support member 220 because it has fewer engaging surfaces.

Figure 6:
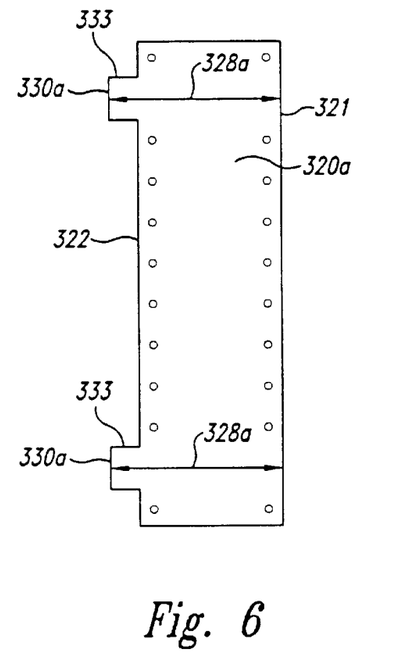
FIG. 6 is a top plan view of a support member having straight engaging surfaces in accordance with yet another embodiment of the invention.

FIG. 6 is a top plan view of a support member 320a having a first edge 321, a second edge 322 opposite the first edge 321, and two straight engaging surfaces 330a in accordance with another embodiment of the invention. In one aspect of this embodiment, each engaging surface 330a defines the outer edge of a tab 333 that projects outwardly from the second edge 322 of the support member 320a. Each engaging surface 330a can be offset from the first edge 321 of the support member 320a by a distance 328a having a tolerance band within the range described above with reference to FIGS. 3 and 4. In one aspect of this embodiment, the support member 320a can be sealed against an edge of a mold by alignment pins generally similar to the alignment pins 170 described above with reference to FIG. 4, but having a flat outer surface (rather than the rounded surface shown in FIG. 4) that contact the flat engaging surfaces 330a. Such alignment pins are described in greater detail below with reference to FIG. 9.

Figure 7:
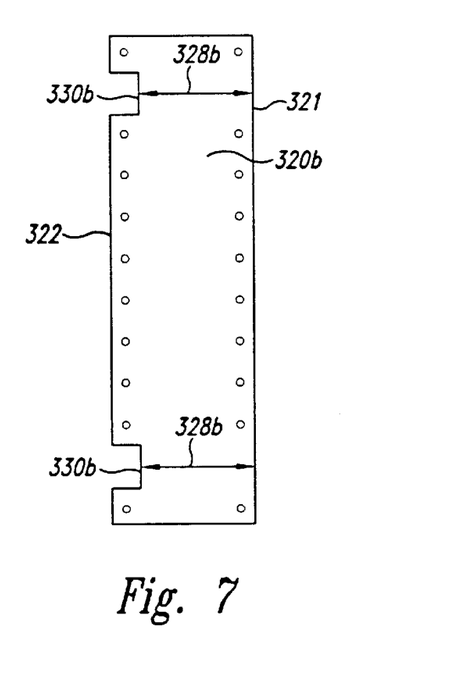
FIG. 7 is a top plan view of a support member having straight, recessed engaging surfaces in accordance with another embodiment of the invention.

FIG. 7 is a top plan view of another embodiment of a support member 320b having recessed straight engaging surfaces 330b. Each engaging surface 330b forms one edge of a rectangular cutout in the second edge 322 of the support member 320b. The engaging surfaces 330b can be spaced apart from the first edge 321 of the support member 320b by a distance 328b having a tolerance band within the range described above with reference to FIGS. 3 and 4.

Figure 8:
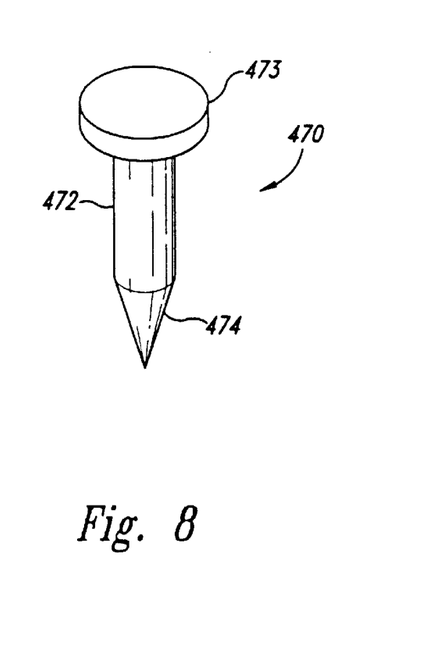
FIG. 8 is a top isometric view of an alignment pin having a straight tapered surface in accordance with still another embodiment of the invention.

FIG. 8 is a top isometric view of an alignment pin 470 having a head 473, a shank 472 below the head 473, and a tapered end portion 474 in accordance with an embodiment of the invention. In one aspect of this embodiment, the alignment pin 470 is shaped to be positioned in the upper portion 151 of the mold apparatus 150 described above with reference to FIG. 4. In a further aspect of this embodiment, the tapered end portion 474 can have a conical shape. Alternatively, the tapered end portion 474 can have a more rounded or parabolic shape, as shown in FIG. 4. In other embodiments, the tapered end portion 474 can have other shapes that are configured to engage the engaging surface 130 of the support member 120 and bias the support member 120 against the mold edge 159 described above with reference to FIG. 4.

Figure 9:
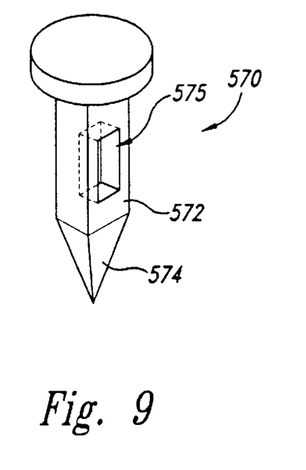
FIG. 9 is a top isometric view of an alignment pin having flat tapered surfaces in accordance with yet another embodiment of the invention.

FIG. 9 is a top isometric view of an alignment pin 570 having a rectangular shank 572 and a pyramidal tapered end portion 574. Accordingly, the alignment pin 570 can engage the recessed, straight engaging surface 330b of the support member 320b, described above with reference to FIG. 7. The alignment pin 570 can also engage other straight engaging surfaces, such as the outwardly projecting engaging surfaces 330a described above with reference to FIG. 6. For example, in one aspect of this embodiment, the shank 572 can have a recess 575 sized to fit around at least a portion of the tab 333 shown in FIG. 6.

Figure 10:
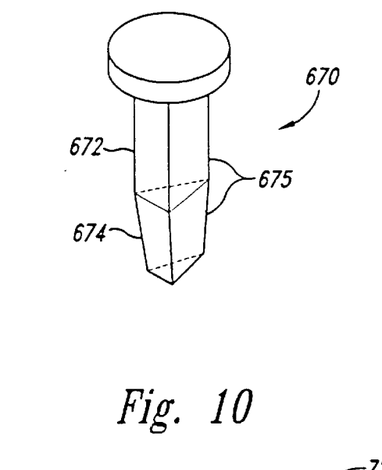
FIG. 10 is a top isometric view of an alignment pin having a sharpened edge in accordance with still another embodiment of the invention.

FIG. 10 is a top isometric view of an alignment pin 670 having a shank 672, a tapered end portion 674, and a sharpened edge 675 in accordance with another embodiment of the invention. In one aspect of this embodiment, the sharpened edge 675 is sharp enough to pierce the engaging surface of any of the support members described above with reference to FIGS. 3–7. Accordingly, the alignment pin 670 can be shaped to engage a curved or straight engaging surface, depending upon the configuration of the support member. An advantage of the sharpened edge 675 is that it can relieve stresses in the support member that may be created as the support member is biased against the mold edge 159 (FIG. 4). Accordingly, the support member may be less likely to buckle or break as it is biased against the mold edge 159. Conversely, an advantage of alignment pins that do not pierce the engaging surfaces is that they may be less likely to form cracks or splits in the support member as they bias the support member against the mold edge 159.

Figure 11:
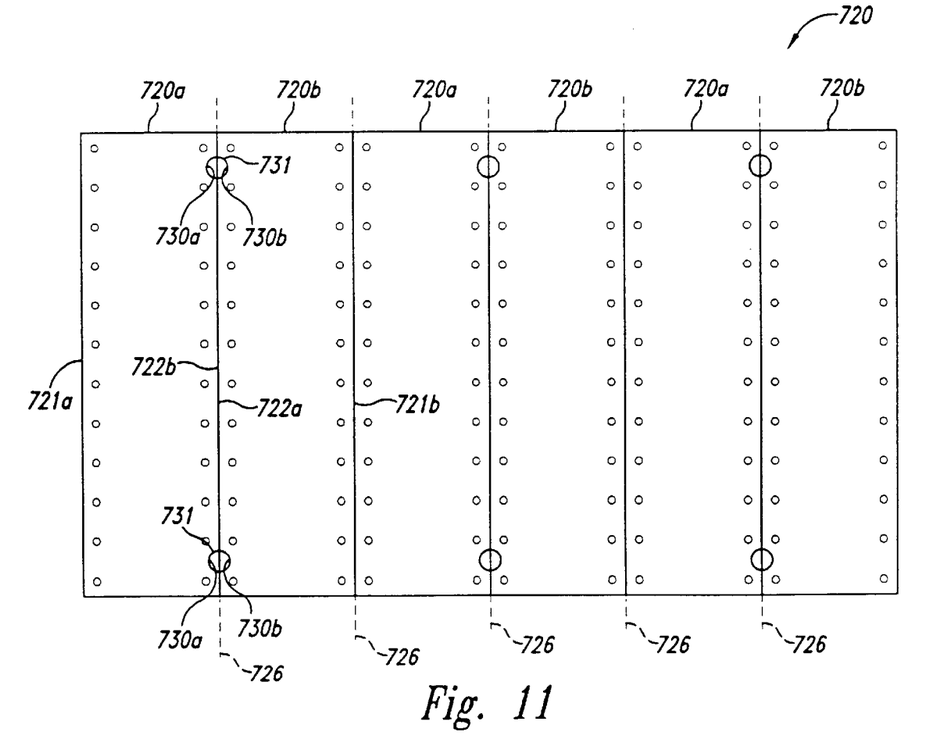
FIG. 11 is a top plan view of an assembly of substrates having engaging surfaces formed in accordance with another embodiment of the invention.

FIG. 11 is a top plan view of a support member assembly 720 that includes a sheet of support member material configured to be singulated into a plurality of support members (shown as left support members 720a adjacent to right support members 720b). The support members 720a and 720b are separated from each other by singulating the support member assembly 720 along singulation axes 726. Accordingly, each left support member 720a has a first edge 721a and a second edge 722a, and each right support member 720b has a first edge 721b and a second edge 722b. In one aspect of this embodiment, the second edge 722a of each left support member 720a is positioned adjacent the second edge 722b of the adjacent right support member 720b. Accordingly, a plurality of alignment apertures 731 can be formed in the support member assembly 720 to straddle the singulation axes 726 between the second edges 722a and 722b of adjacent support members. Each alignment aperture 731 therefore includes a left engaging surface 730a in one of the left support members 720a and a right engaging surface 730b in the adjacent right support member 720b.

In one embodiment, the alignment apertures 731 can be formed with mechanical drill bits, or alternatively the alignment apertures 731 can be formed with water jets, lasers or other suitable methods. In any of these embodiments, an advantage of this arrangement is that each alignment aperture 731 forms two engaging surfaces. Accordingly, the cost for forming the support members 720a and 720b can be reduced by reducing the number of machining operations required to form the alignment apertures 731.

Figure 12:
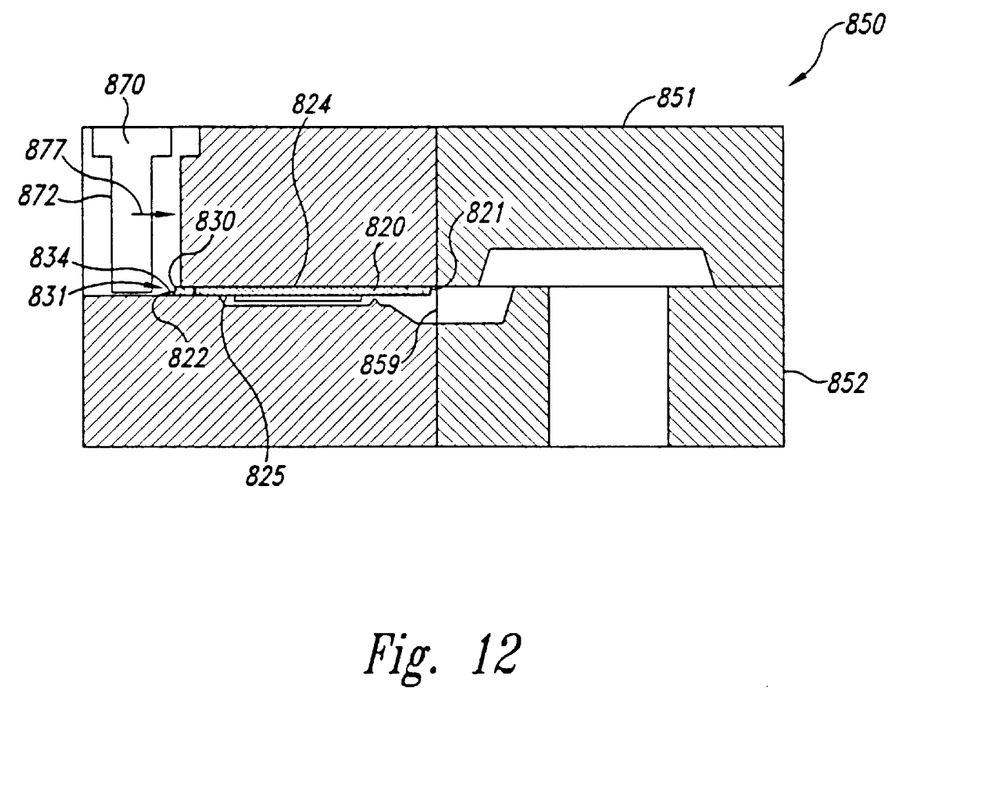
FIG. 12 is a cross-sectional side elevational view of a support member positioned in a mold apparatus having an alignment pin that moves transversely in accordance with another embodiment of the invention.

FIG. 12 is a cross-sectional side elevational view of a support member 820 positioned in a mold apparatus 850 in accordance with another embodiment of the invention. In one aspect of this embodiment, the support member 820 includes a first edge 821, a second edge 822, an upper surface 824, a lower surface 825, and an alignment aperture 831 that extends part-way through the support member 820 from the upper surface 824. Accordingly, the alignment aperture 831 can have an aperture end 834 that is offset from both the upper surface 824 and the lower surface 825 of the support member 820. The alignment aperture 831 defines an engaging surface 830 that extends from the upper surface 824 to the aperture end 834 and is formed such that a distance between the alignment aperture 831 and the first edge 821 is within the tolerance range described above with reference to FIGS. 3 and 4.

In another aspect of this embodiment, the mold apparatus 850 can include an upper portion 851, a lower portion 852 and an alignment pin 870 that translates toward the second edge 822 of the support member 820 to contact the engaging surface 831 and bias a first edge 821 of the support member 820 against a mold edge 859 of the mold apparatus 850. For example, the alignment pin 870 can move from left to right as indicted by arrow 877 to engage and bias the support member 820. In a further aspect of this embodiment, the alignment pin 870 can be locked in place once it is in the biased position. In still a further aspect of this embodiment, the alignment pin need not include a tapered end, but can instead have a generally straight shank 872 for engaging the support member 820.

From the foregoing it will be appreciated that specific embodiments of the invention have been described herein for purposes of illustration, but that various modifications may be made without deviating from the spirit and scope of the invention. Accordingly, the invention is not limited except as by the appended claims.

What is claimed is:

1. A support member for supporting a microelectronic device in a mold, comprising a support member body having:
   a first surface configured to engage the microelectronic device;
   a second surface facing opposite the first surface;
   electrically conductive material at the first and/or second surface and/or between the first and second surfaces;
   a first edge between the first and second surfaces configured to engage an interior wall of the mold;
   a second edge between the first and second surfaces facing opposite the first edge; and
   an engaging surface configured to engage an aligning member of the mold, the engaging surface spaced apart from the first edge by a selected distance having a tolerance range of ±50 microns or less.

2. The support member of claim 1 wherein the second surface of the support member has a concave aperture, a wall of the concave aperture defining the engaging surface.

3. The support member of claim 1 wherein the engaging surface is defined at least in part by an aperture extending through the support member and spaced apart from the first and second edges.

4. The support member of claim 1 wherein the engaging surface is defined at least in part by a hole drilled through the support member.

5. The support member of claim 1 wherein the engaging surface is defined at least in part by a tab extending away from the second edge of the support member.

6. A support member for supporting a microelectronic device in a mold, comprising a support member body having:
   a first surface configured to engage the microelectronic device;
   a second surface facing opposite the first surface;
   electrically conductive material at the first and/or second surface and/or between the first and second surfaces;
   a first edge between the first and second surfaces configured to engage an interior wall of the mold;
   a second edge between the first and second surfaces facing opposite the first edge;
   a plurality of index holes between the first and second edges; and
   an engaging surface extending between the first and second surfaces configured to engage an aligning member of the mold, the engaging surface spaced apart from the first edge by a selected distance having a tolerance range.

7. The support member of claim 6 wherein the tolerance range is ±50 microns or less.

8. The support member of claim 6 wherein the second surface of the support member has a concave aperture, a wall of the concave aperture defining the engaging surface.

9. A support member for supporting a microelectronic device in a mold, comprising a support member body having:
   a first surface configured to engage the microelectronic device;
   a second surface facing opposite the first surface;
   electrically conductive material at least proximate to at least one of the first and second surfaces;
   a first edge between the first and second surfaces configured to engage an interior portion of the mold;
   a second edge between the first and second surfaces facing opposite the first edge; and
   a contact surface configured to contact an aligning member of the mold, the contact surface being spaced apart from the first edge by a selected distance having a tolerance range or ±50 microns or less.

10. The support member of claim 9 wherein the second surface of the support member has a concave aperture, and wherein a wall of the concave aperture defines at least part of the contact surface.

11. The support member of claim 9 wherein the contact surface is defined at least in part by an aperture extending through the support member and spaced apart from the first and second edges.

12. The support member of claim 9 wherein the contact surface is defined at least in part by an aperture extending through the support member from the first surface to the second surface, and wherein a wall of the aperture forms a corner with the second edge of the support member body.

13. The support member of claim 9 wherein the contact surface is defined at least in part by a tab extending away from the second edge of the support member.

* * * * *